(12) United States Patent
Meynants

(10) Patent No.: US 11,405,602 B2
(45) Date of Patent: Aug. 2, 2022

(54) PIXEL STRUCTURE, IMAGE SENSOR DEVICE AND SYSTEM WITH PIXEL STRUCTURE, AND METHOD OF OPERATING THE PIXEL STRUCTURE

(71) Applicant: ams AG, Premstaetten (AT)

(72) Inventor: Guy Meynants, Premstaetten (AT)

(73) Assignee: AMS AG, Premstätten (AT)

( * ) Notice: Subject to any disclaimer, the term of this patent is extended or adjusted under 35 U.S.C. 154(b) by 106 days.

(21) Appl. No.: 16/771,288

(22) PCT Filed: Dec. 10, 2018

(86) PCT No.: PCT/EP2018/084188
§ 371 (c)(1),
(2) Date: Jun. 10, 2020

(87) PCT Pub. No.: WO2019/115459
PCT Pub. Date: Jun. 20, 2019

(65) Prior Publication Data
US 2020/0382762 A1 Dec. 3, 2020

(30) Foreign Application Priority Data

Dec. 15, 2017 (EP) .................................... 17207772

(51) Int. Cl.
*H04N 13/254* (2018.01)
*H04N 5/374* (2011.01)
(Continued)

(52) U.S. Cl.
CPC ....... *H04N 13/254* (2018.05); *G01B 11/2513* (2013.01); *H04N 5/374* (2013.01);
(Continued)

(58) Field of Classification Search
None
See application file for complete search history.

(56) References Cited

U.S. PATENT DOCUMENTS 9,001,245 B2 4/2015 Wang et al.
2004/0013232 A1* 1/2004 Rahn .................. H04N 3/155
378/98.8
(Continued)

FOREIGN PATENT DOCUMENTS

CN 101237531 A 8/2008
CN 102813530 A 12/2012
(Continued)

OTHER PUBLICATIONS

Bamji, C. S. et al., "A 0.13 μm CMOS System-on-Chip for a 512 × 424 Time-of-Flight Image Sensor With Multi-Frequency Photo-Demodulation up to 130 MHz and 2 GS/s ADC", IEEE J. of Solid-state Circuits, vol. 50, No. 1, Jan. 2015, pp. 303-319.
(Continued)

*Primary Examiner* — Long Pham
(74) *Attorney, Agent, or Firm* — MH2 Technology Law Group LLP

(57) ABSTRACT

A photodetector in semiconductor material is provided with a first transfer gate between the photodetector and a first diffusion region in the semiconductor material, a second transfer gate between the photodetector and a second diffusion region in the semiconductor material, a capacitor connected between the first diffusion region and the second diffusion region, a first switch connected between the first diffusion region and a first reference voltage, and a second switch connected between the second diffusion region and a second reference voltage.

17 Claims, 5 Drawing Sheets

(51) Int. Cl.
  *H04N 5/378* (2011.01)
  *H04N 5/3745* (2011.01)
  *G01B 11/25* (2006.01)
  *H01L 27/146* (2006.01)

(52) U.S. Cl.
  CPC ......... *H04N 5/378* (2013.01); *H04N 5/37452* (2013.01); *H01L 27/14643* (2013.01)

(56) References Cited

U.S. PATENT DOCUMENTS

| | | |
|---|---|---|
| 2005/0051707 A1 | 3/2005 | Bamji et al. |
| 2008/0079833 A1* | 4/2008 | Ichikawa ............ G01S 17/894 348/311 |
| 2010/0308209 A1* | 12/2010 | Buettgen ............ H04N 5/359 250/208.1 |
| 2011/0234836 A1 | 9/2011 | Machida |
| 2012/0312966 A1 | 2/2012 | Suzuki et al. |
| 2013/0015324 A1 | 1/2013 | Park et al. |
| 2014/0240692 A1 | 8/2014 | Tien et al. |
| 2018/0331137 A1* | 11/2018 | Jacob ................ H04N 5/37452 |

FOREIGN PATENT DOCUMENTS

| | | |
|---|---|---|
| CN | 106020524 A | 10/2016 |
| CN | 108270981 A | 7/2018 |
| EP | 0408025 A2 | 1/1991 |
| EP | 2541275 A1 | 1/2013 |

OTHER PUBLICATIONS

Büttgen, B., "RnD Activities 3D-Imaging", , Heptagon, V0-5 Jul. 7, 2017, 20 pages.
Innocent, M. et al.: "Differential image sensor with high common mode rejection", Proceedings of ESSCIRC, Grenoble, France, 2005, pp. 483-486.
Ruythooren, K. et al.: "WP1a Report: Pixel Design and Process Study", for the development of TOF for Stanley Electric Co., Ltd., Oct. 5, 2016, 27 pages.
European Patent Office, International Search Report for PCT/EP2018/084188 dated Dec. 15, 2019.
Chinese First Office Action and (with English Summary and Translation) in Chinese Application 20188007312.3 dated Feb. 9, 2022, 14 pages.
Chinese Search Report (with English Translation) in Chinese Application No. 2018800731253 dated Jan. 29, 2022, 7 pages.

* cited by examiner

PIXEL STRUCTURE, IMAGE SENSOR DEVICE AND SYSTEM WITH PIXEL STRUCTURE, AND METHOD OF OPERATING THE PIXEL STRUCTURE

The present disclosure applies to the field of three-dimensional imaging, especially differential imaging.

BACKGROUND OF THE INVENTION

Active stereovision systems make use of a projector and at least one image sensor. Typically the projector projects a structured light pattern that is composed of dots, lines or other shapes which are projected on the scene by infrared light, which may typically have a wavelength of 940 nm, for instance. The pattern is then recorded by a global-shutter two-dimensional image sensor including a two-dimensional matrix of pixels. The image sensor may be optimized for a good response at the used wavelength.

The light pattern can be projected by a strong light source, such as a VCSEL (vertical-cavity surface-emitting laser) during a short time. The maximum emitted light power is constrained by eye safety limitations and by the maximal power that can be output by the VCSEL at a specified duty cycle. Usually short pulses of few microseconds to few milliseconds are used. A pattern is created, e.g. by a mask, which is projected by an optical system (e.g a lens and/or an optical diffractive element) onto the scene.

A two-dimensional camera records the projected pattern. The position of the pattern as seen in the recorded image depends on the distance of the objects to the camera and projector. By triangulation the distance can be recorded. Other computation techniques may involve deep learning, for example in a case where the projected patterns changes appearance depending on object distance, thanks to some optical effect like focus distance or interference.

Some systems use two cameras and employ stereovision to make a depth map. A pattern is projected to create some contrast in the scene. This may be needed for objects without much texture, e.g. a painted wall. In those cases a flashed illumination is used.

In the above described stereovision and structured light cases, the light is pulsed and illuminated only during short time. The image sensor works in 'global shutter' mode. Before the flash, all pixels are reset and start integrating light. Then the pattern is projected. After the light pulse, the exposure time stops. In the pixels, the signal from the photodiode is sampled on an in-pixel memory. That memory is then read out row-by-row after the exposure time. This is a typical way of operation of global shutter image sensors, in so-called 'triggered global shutter mode'.

A rolling shutter pixel can instead be used. Because of the significantly larger contribution of background light to the captured signal, fast readout and off-chip data buffer storage are required.

Background image subtraction can be used to improve the contrast in the image. A second image is captured with the same exposure time but without projected light. The differential image is then calculated by software. The subtraction operation is preferably executed inside the pixel during the image acquisition phase. It is favourable if multiple image acquisitions can be accumulated in the pixel, because a large amount of acquisition cycles enables to enhance the signal-to-noise ratio. After each image acquisition, the signal corresponding to the difference between the images with and without structured light projection remains stored in the pixel. Signals from successive subtraction operations are thus accumulated in the pixel.

U.S. Pat. No. 8,569,671 B2 discloses a pixel comprising a photo-sensitive element for generating charges in response to incident radiation. A transfer gate is positioned between the photo-sensitive element and a sense node for controlling transfer of charges to the sense node. A reset switch is connected to the sense node for resetting the sense node to a predetermined voltage. A first buffer amplifier has an input connected to the sense node. A sample stage is connected to the output of the first buffer amplifier and is operable to sample a value of the sense node. A second buffer amplifier has an input connected to the sample stage. Control circuitry operates the reset switch and causes the sample stage to sample the sense node while the photo-sensitive element is being exposed to radiation. An array of pixels is synchronously exposed to radiation. Sampled values for a first exposure period can be read while the photo-sensitive element is exposed for a second exposure period.

SUMMARY OF THE INVENTION

The definitions as described above also apply to the following description unless stated otherwise.

The pixel structure for a semiconductor imaging device comprises a photodetector in a semiconductor material, a first transfer gate between the photodetector and a first diffusion region in the semiconductor material, a second transfer gate between the photodetector and a second diffusion region in the semiconductor material, a capacitor connected between the first diffusion region and the second diffusion region, a first switch connected between the first diffusion region and a first reference voltage, and a second switch connected between the second diffusion region and a second reference voltage.

In an embodiment of the pixel structure, the photodetector is a pinned photodiode in a substrate comprising the semiconductor material.

A buffer amplifier is connected to one of the diffusion regions to read out the pixel. In a further embodiment, buffer amplifiers are connected to the first diffusion region and the second diffusion region. In such an embodiment there may also be an additional anti-blooming gate connected to the photodetector to avoid carriers flowing into the diffusion region after the exposures.

In a further embodiment, the first reference voltage and the second reference voltage are equal, in particular equal to a supply voltage. The first reference voltage or the second reference voltage may be connected to a supply voltage.

In a further embodiment, a select transistor is connected to a column bus. A source follower formed by a field-effect transistor can be connected to the select transistor, a gate of the source follower being connected to the first diffusion region. This is a possible way of implementing the buffer amplifier.

The image sensor device comprises a two-dimensional array of such pixel structures.

The imaging system including such an image sensor device further comprises a light source synchronized to the image sensor device, the light source being configured to be active when the signal is acquired on the first diffusion region and not active when the signal is acquired on the second diffusion region. The light source may instead be configured to be active when the signal is acquired on the second diffusion region and not active when the signal is acquired on the first diffusion region. In particular, the light source can be configured to project a pattern or sequence of patterns on a scene to be imaged.

The method of operating the pixel structure comprises discharging the capacitor by closing both the first switch and the second switch into a connecting state, acquiring a first signal on the photodetector and transferring the first signal to the first diffusion region by a charge transfer pulse on the first transfer gate, while the second switch is closed in a connecting state, acquiring a second signal on the photodetector and transferring the second signal to the second diffusion region by a charge transfer pulse on the second transfer gate, while the first switch is closed in a connecting state, and after acquisition of the signals, reading the pixel signal out from the first diffusion region while the second diffusion region is connected to the second reference voltage via the second switch.

In a variant of the method, the second transfer gate is at a higher electric potential than the first transfer gate during readout of the pixel signal.

Using the method, first and second signals can repeatedly be acquired and accumulated on the capacitor.

In a further variant of the method, the charge transfer pulse on the first transfer gate, the charge transfer pulse on the second transfer gate, or each of the charge transfer pulses is a multiple pulse, so that the corresponding transfer gate is pulsed several times during the same charge transfer operation.

BRIEF DESCRIPTION OF THE DRAWINGS

The following is a detailed description of examples of the pixel structure in conjunction with the appended figures.

DETAILED DESCRIPTION

Figure 1:
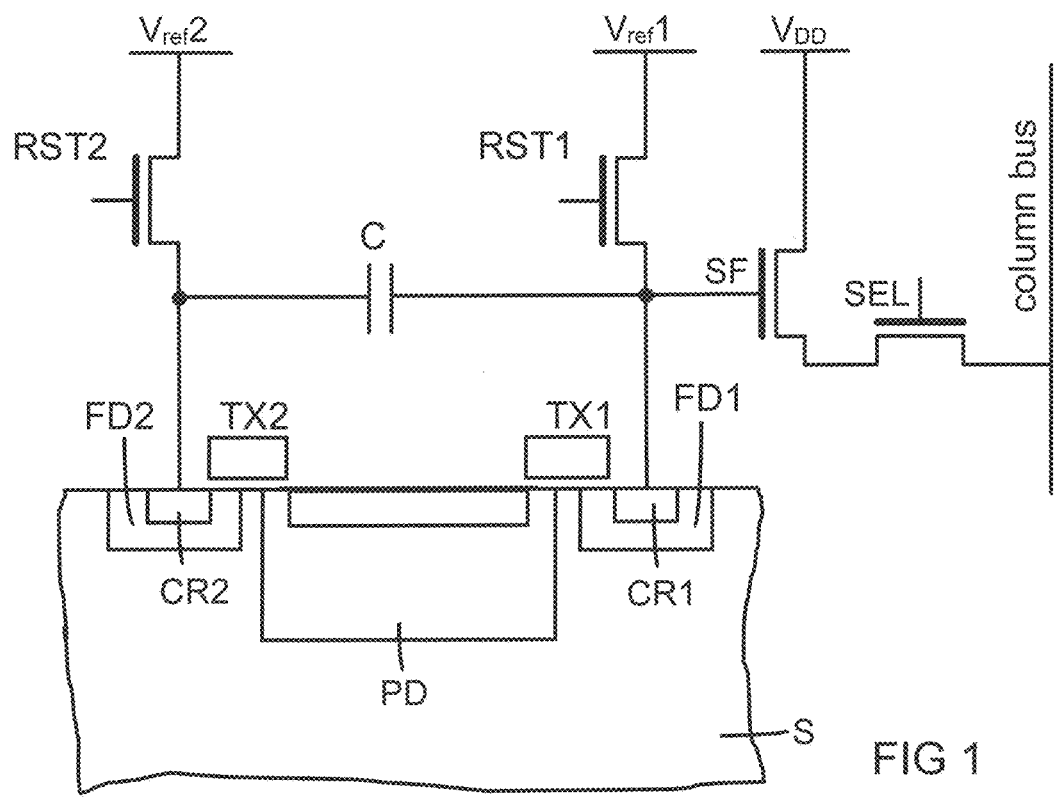
FIG. 1 shows a pixel circuit including a schematical cross section of a pinned photodiode.

FIG. 1 shows an example of the pixel structure. The circuit of the pixel structure includes a schematical cross section of a semiconductor photodetector device, which can be used for the pixel structure. A photodetector PD, which may be a pinned photodiode, for example, is integrated in semiconductor material S, in particular in a semiconductor substrate, which may comprise silicon, for instance. The photodetector PD can be connected with a first diffusion region FD1 in the semiconductor material S via a first transfer gate TX1 and with a second diffusion region FD2 in the semiconductor material S via a second transfer gate TX2.

The diffusion regions FD1, FD2 may be arranged on opposite sides of the photodetector PD and may be provided with a first contact region CR1 and a second contact region CR2, respectively. The contact regions CR1, CR2 may have a higher doping concentration to enable the formation of an ohmic contact for external electric connections.

Typically the substrate may be composed of a bulk silicon wafer (e. g. p++ doped) with an epitaxial layer (e. g. p−, $5 \times 10^{14}$ cm$^{-3}$). The pinned photodiode may comprise a p++ shallow surface implant and a deeper n-type implant. The first contact region CR1 and the second contact region CR2 may be highly doped (e. g. $5 \times 10^{19}$ cm$^{-3}$) n-type implants. They may be surrounded by lower doped n-type implants, and may or may not be located in a p-well area (which may be typically doped with a doping concentration of about $1 \times 10^{17}$ cm$^{-3}$).

The diffusion regions FD1, FD2 are electrically connected with each other via a capacitor C, which may typically have a capacitance of about 15 fF, for instance. The first diffusion region FD1 is also connected to a first reference voltage $V_{ref}1$ via a first switch RST1, and the second diffusion region FD2 is also connected to a second reference voltage $V_{ref}2$ via a second switch RST2. The first and second switches RST1, RST2 can be field-effect transistors, for instance. The first reference voltage $V_{ref}1$ and the second reference voltage $V_{ref}2$ may be equal or different.

The first diffusion region FD1 is further connected to a buffer amplifier. This could be a source follower SF as shown in FIG. 1. The first diffusion region FD1 may in this case especially be connected to the gate of a further field-effect transistor, for instance. The source follower SF connects a supply voltage $V_{DD}$ with a source/drain terminal of a select transistor SEL. The other source/drain terminal of the select transistor SEL is connected with a column bus for read-out. The supply voltage $V_{DD}$ may in particular be used as the first reference voltage $V_{ref}1$ and the second reference voltage $V_{ref}2$. The source follower SF and the select transistor SEL may also be integrated in the semiconductor material S. Alternatively to the source follower, a junction FET could be used, or a differential amplifier configuration could be used.

Figure 2:
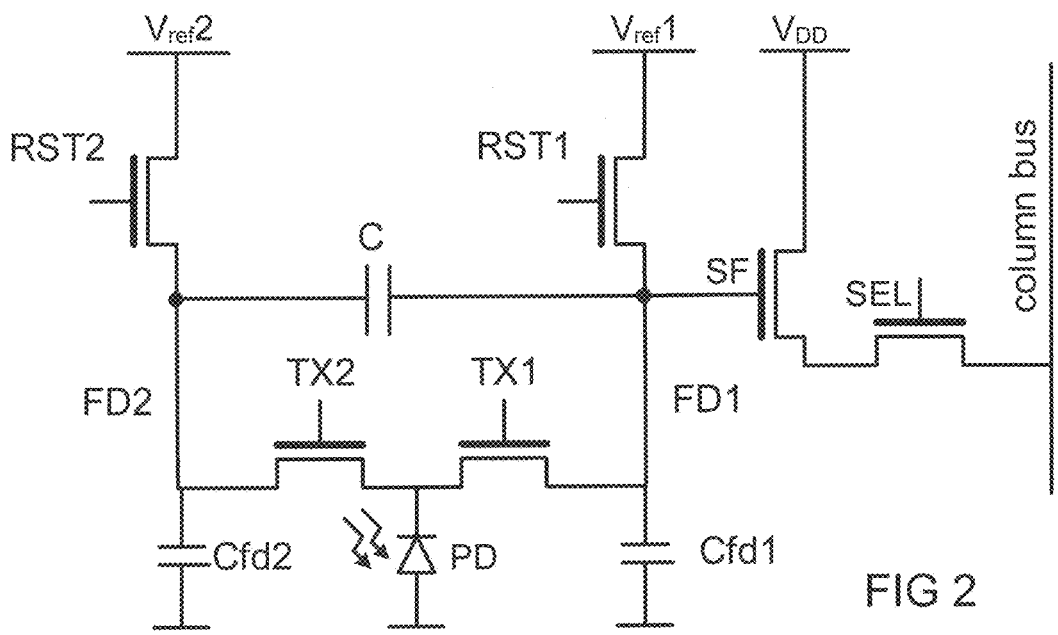
FIG. 2 shows a circuit diagram of the pixel circuit according to FIG. 1.

FIG. 2 shows a complete circuit diagram of the pixel circuit according to FIG. 1. The node of the first diffusion region FD1 has a first parasitic capacitance Cfd1, and the node of the second diffusion region FD2 has a second parasitic capacitance Cfd2. It is advantageous if the parasitic capacitances Cfd1, Cfd2 are equal and as small as possible. The capacitance of the capacitor C is considerably larger than the first and second parasitic capacitances Cfd1, Cfd2. Typical values of the first and second parasitic capacitances Cfd1 and Cfd2 could be in the range from 1 fF to 4 fF. Techniques could be used to reduce the parasitic capacitances. Each of these parasitic capacitances Cfd1 and Cfd2 is composed of the junction capacitance of the diffusion region, the gate-drain overlap capacitance of the transfer gates, the input capacitance of the buffer amplifier and the gate-drain overlap capacitance of the reset transistor. The overlap capacitances could be reduced by dedicated implant schemes, e. g. with modifications of dopant concentrations at lightly doped drain areas (LDDs) located adjacent to the gate under the gate spacer region. The junction capacitance and junction sidewall capacitance in particular can be changed by reducing the doping of the p-well under the n+ diffusion area, or by using a moderately doped n-type diffusion surrounding the higher doped n++ ohmic contact area. The latter is shown in FIG. 1. The capacitance of the buffer amplifier can be reduced by the input transistor topology. E. g. a buried channel source follower or JFET could be used with lower input capacitance. Both devices have the additional benefit that they have lower 1/f and random-telegraph-signal noise, which is also a benefit to reduce the read noise of the pixel.

Charges are dumped for successive frames consecutively on the first diffusion region FD1, while the second diffusion region FD2 is kept at the second reference voltage $V_{ref}2$ via the second switch RST2, and on the second diffusion region FD2, while the first diffusion region FD1 is kept at the first reference voltage $V_{ref}1$ via the first switch RST1. The reference voltages $V_{ref}1$ and $V_{ref}2$ are chosen such that the signal swing on nodes FD1 and FD2 can be maximized.

An image with active illumination (e. g. when a structured light pattern is projected) may be integrated using the first diffusion region FD1, while a background reference image may be integrated using the second diffusion region FD2. In this case the signal at the first diffusion region FD1 will drop faster than the signal at the second diffusion region FD2. After several acquisitions of illuminated and background reference images, as per the later described timing diagrams, where the illuminated image is always transferred to FD1 and the background reference voltage is always transferred to FD2, the voltage on FD1 will drop below $V_{ref}1$ and the voltage on FD2 will rise above $V_{ref}2$. It is then beneficial to use a low voltage for $V_{ref}2$ and a high voltage for $V_{ref}1$. It should be ensured that the voltage levels on FD1 and FD2 are always higher than the depletion voltage of the pinned photodiode at the moment that the respective transfer gate TX1 or TX2 is opened. This is needed to guarantee a charge transfer of all carriers from the photodiode to the nodes FD1 and FD2.

Figure 3:
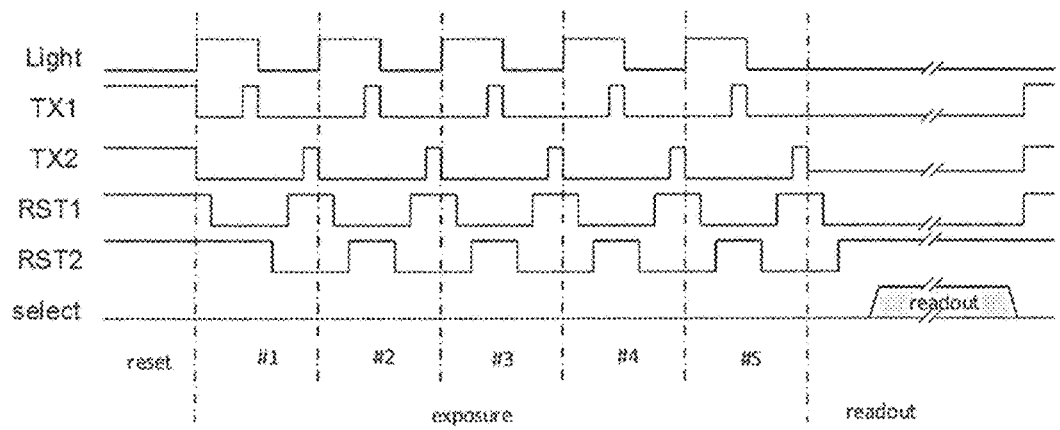
FIG. 3 is a timing diagram for the pixel structure.

FIG. 3 shows a timing diagram for this pixel structure. The operation of the pixel structure is synchronously performed with the operation of a structured-light projector for multiple image acquisitions in global shutter mode. A first image is taken under structured-light conditions. The photocarriers from this image exposure are integrated on the photodiodes of the pixel. The photodiode is then read out by a charge transfer through the first transfer gate TX1 with the first switch RST1 in its disconnecting state and the second switch RST2 in its connecting state, so that the signal is transferred to the first diffusion region FD1. The first diffusion region FD1 is thus floating when the first switch RST1 is in its disconnecting state. The diffusion region must be floating when the corresponding transfer gate is operated. A further image is taken without structured light. The photocarriers are again integrated on the photodiode. The photodiode is then read out by a charge transfer though the second transfer gate TX2 with the first switch RST1 in its connecting state and the second switch RST2 in its disconnecting state, so that the signal is transferred to the second diffusion region FD2.

The first and second switches RST1, RST2 are alternatingly operated to remove the common mode signal corresponding to the background light. The first switch RST1 is in its connecting state only when the second switch RST2 is in its disconnecting state and vice versa, in order to prevent the capacitor C from being discharged. The driving circuits should guarantee that the RST1 and RST2 signals are non-overlapping, in order to avoid this discharge. Only at the start of the image acquisition process, both switches are switched on together, in order to reset the capacitor C.

After the time period of exposure, the differential image is read out from the first diffusion region FD1 using the source follower SF and the select transistor SEL. For this purpose, the first switch RST1 is in its disconnecting state, and the second switch RST2 is in its connecting state, so that the second diffusion region FD2 is at least approximately on the second reference voltage $V_{ref}2$, and the first diffusion region FD1 provides the stored signal. The voltage at the second transfer gate TX2 is higher than the voltage at the first transfer gate TX1, and the second transfer gate TX2 is acting as anti-blooming drain during readout. When the photodetector PD saturates, excess charge is removed by means of the second transfer gate TX2 and the second switch RST2. Alternatively, the second transfer gate TX2 could be in a high state during readout.

The pixel can also be operated as a standard rolling shutter pixel, by not clocking the transfer gate TX2 and the second switch RST2.

Figure 4:
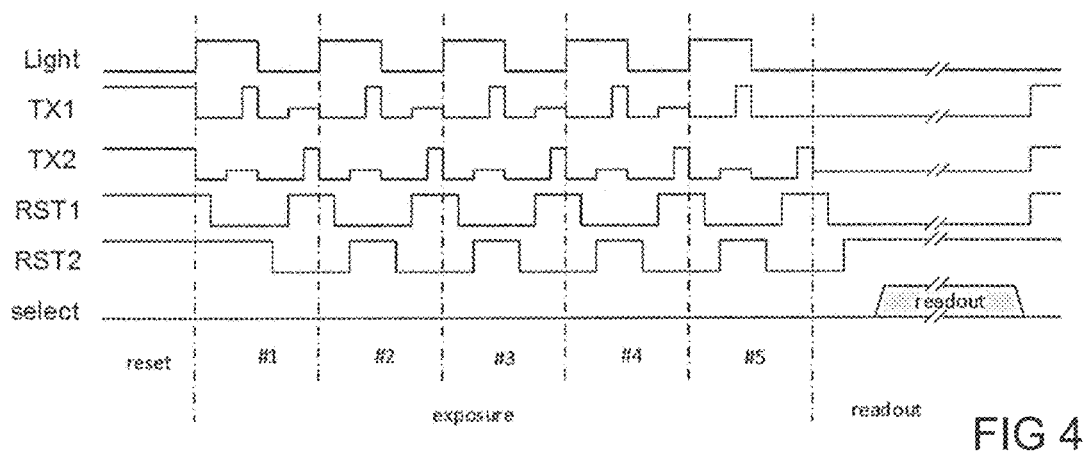
FIG. 4 is a timing diagram according to FIG. 3 for control of the maximal amount of stored charges.

FIG. 4 shows a further timing diagram. The timing according to this diagram allows to control the maximal amount of charges to be stored on the photodiode. This avoids overflow from the photodetector to the respective diffusion region. This can especially be useful if the illumination is bright. Three distinct voltage levels will be needed for the transfer gate control line if this timing diagram is used: a high voltage to enable charge transfer; a low voltage to prohibit overflow of carriers in case when the photodiode is saturated (under strong light conditions) and a middle voltage level to ensure that overflow of carriers at saturation flows through the transfer gate. The overflow should happen to the diffusion region where the respective RST switch is in its connecting stage, so that this diffusion region is connected to its respective $V_{ref}$ voltage. FIG. 4 shows a particular instance of such timing, but slight modifications can be considered that still are according to the described operation.

Figure 5:
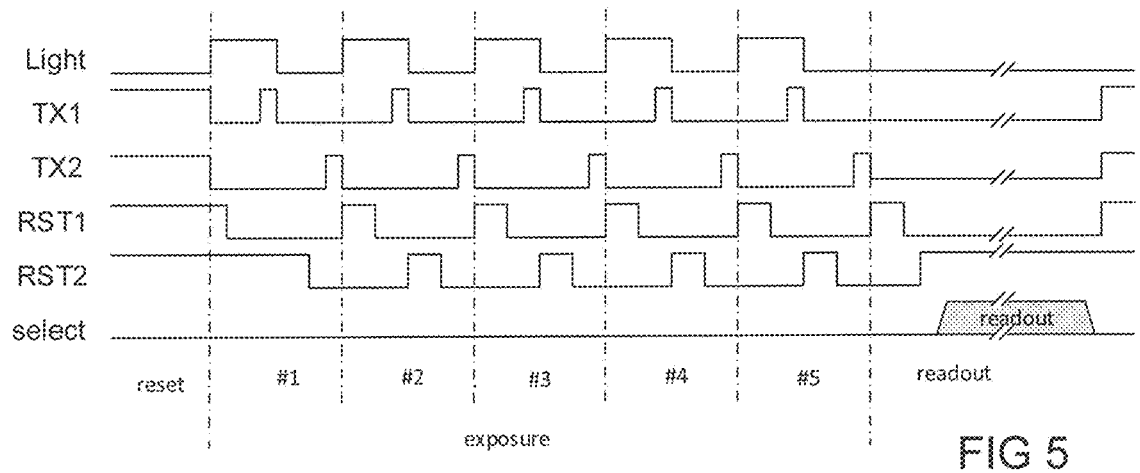
FIG. 5 is an alternative timing diagram according to FIG. 3 for voltage control.

FIG. 5 shows a further timing diagram. This timing avoids excessive voltage at the second diffusion region FD2 by delaying the rising edge of the first switch RST1. The excessive voltage could otherwise cause leakage through the second switch RST2. The timing depends on the different dimensions of the components, including the full-well capacity of the photodiode PD, the capacitance of the capacitor C, and the parasitic capacitances Cfd1 and Cfd2.

Figure 6:
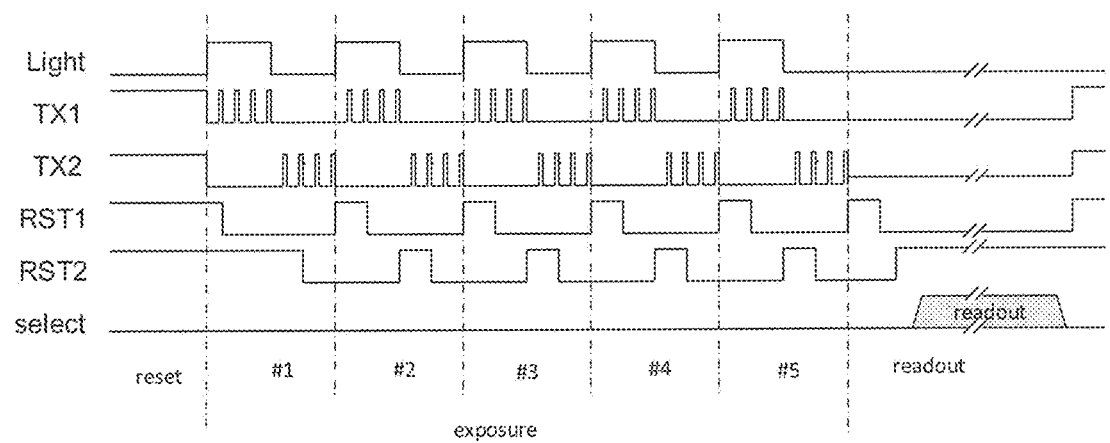
FIG. 6 is an alternative timing diagram according to FIG. 5 for repeated pulsing of the transfer gate(s).

The first transfer gate TX1 may be pulsed several times during the time period when the first switch RST1 is in its disconnecting state and the second switch RST2 in its connecting state, the signal corresponding to the first switch RST1 thus being low. And similarly the second transfer gate TX2 may be pulsed several times during the time period when the first switch RST1 is in its connecting state and the second switch RST2 is in its disconnecting state, the signal corresponding to RST2 thus being low. This multiple pulsing allows to transfer more carriers from the photodiode to the integration capacitor C. Using multiple transfers can reduce the attenuation caused by parasitic capacitances at the nodes formed by the first and second diffusion regions FD1, FD2. A corresponding time diagram is shown in FIG. 6.

Figure 7:
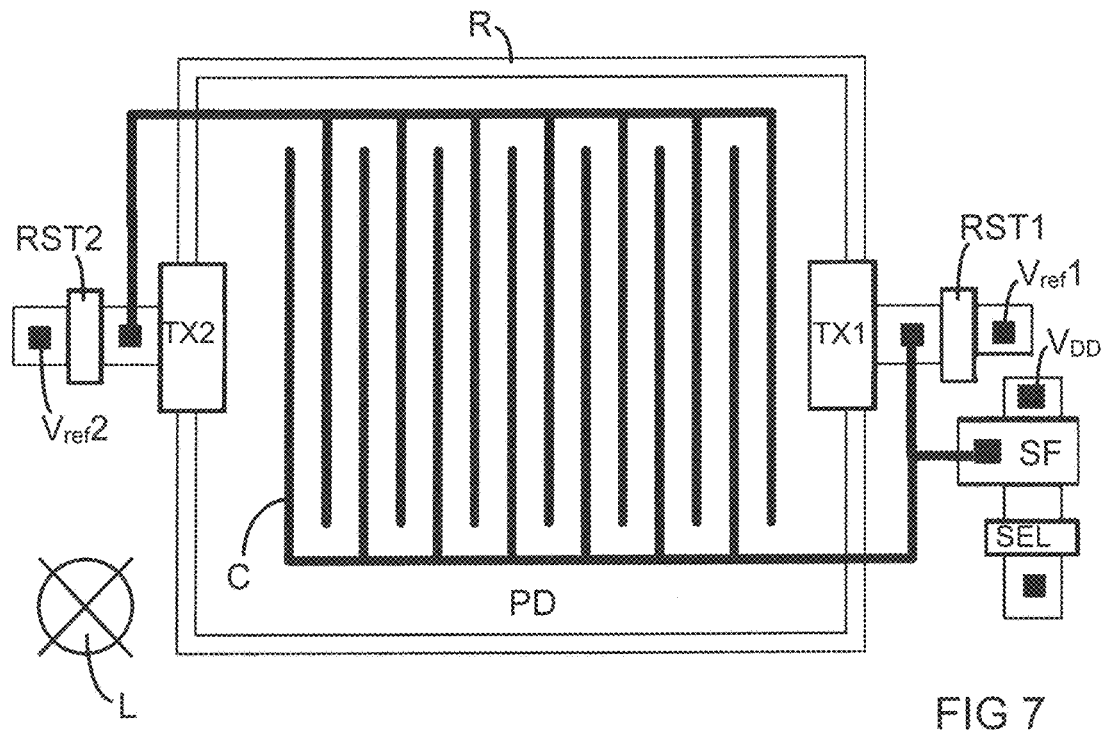
FIG. 7 is a layout example with a capacitor comprising interdigitated conductor tracks.
Figure 8:
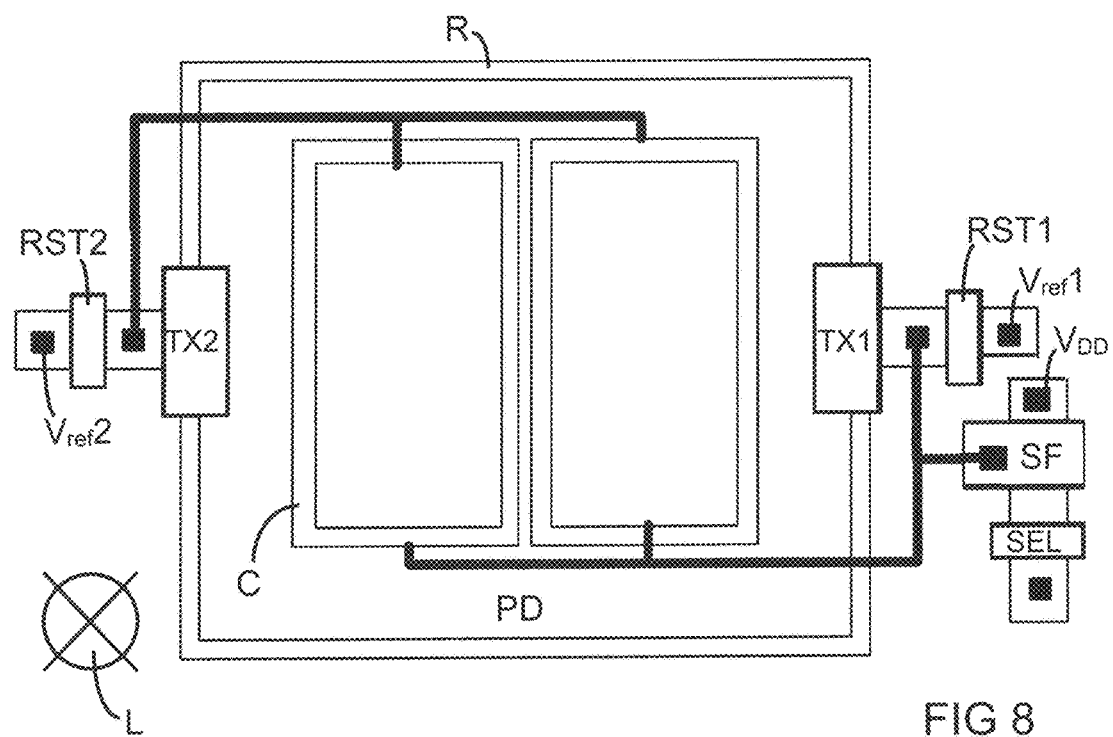
FIG. 8 is a layout example with a plate capacitor.

FIGS. 7 and 8 show layout examples of the proposed pixel structure, in particular for backside-illuminated image sensor technologies.

FIG. 7 shows an example with a capacitor formed by interdigitated conductor tracks, which can be produced in CMOS technology. For backside illumination, this capacitor can be arranged on top of the photodetector PD, so that the incident light is not shielded by the conductor tracks. An optional reflector R can be provided at the bottom of the layers that are produced in the back end of line (BEOL).

FIG. 8 shows an example with a plate capacitor comprising a sequence of a metal plate, a dielectric layer, and a further metal plate, in particular a metal-isolator-metal (MiM) capacitor, which is known per se. In the example shown in FIG. 8, the capacitor C is formed by two individual capacitors connected in anti-parallel fashion, in order to keep the parasitic capacitances of the bottom plate identical for the nodes of the first diffusion region FD1 and the second diffusion region FD2.

Other types of capacitors may be appropriate as well, depending on the individual application of the pixel structure. Examples are trench capacitors and polysilicon-insulator-polysilicon capacitors, which are known per se in semiconductor technology.

Figure 9:
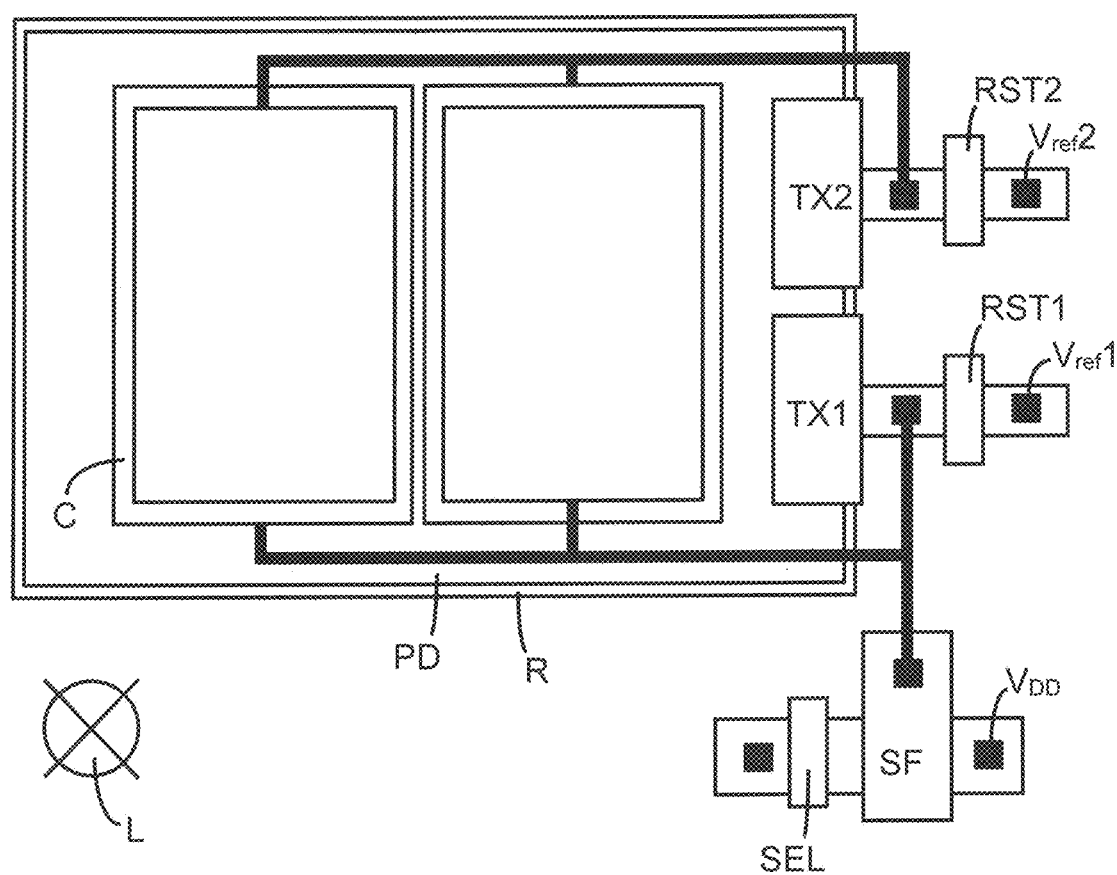
FIG. 9 is a layout example with a plate capacitor and both transfer gates on the same side.

FIG. 9 shows a structure according to FIG. 8 with the difference that the transfer gates TX1, TX2 are located on the same side of the photodetector PD. This arrangement may be advantageous for a more symmetrical pixel layout.

Additionally, a separate anti-blooming gate or photodiode reset gate may be connected. It may also be possible to evacuate and overflow charges from the pinned photodiode via a vertical anti-blooming structure. In that case the photodiode can be reset by a voltage pulse on the substrate under the photodiode.

The pixel can also include a sample stage behind the pixel source follower, especially as described in U.S. Pat. No. 8,569,671 B2, for example. This enables various new read-out modes. It allows to expose the next image during readout, for example. It can also be used to sample the initial reset level and reduce the kTC noise of the pixel.

A two-dimensional array of pixel structures is especially suitable for an image sensor device. An imaging system including such an image sensor device may further comprise a light source synchronized to the image sensor device. A light source L is schematically indicated in FIGS. 7 and 8. The light source can be configured to be active when the signal is acquired on the first floating diffusion FD1 and not active when the signal is acquired on the second floating diffusion FD2, or vice versa. The light source can be used to project a pattern or a sequence of patterns.

In typical applications of the described pixel structure, difference signals are repeatedly obtained by detecting and subtracting two frames, which may be an illuminated frame and a dark frame, for example. The difference signals are additively stored. Thus the signal-to-noise ratio is increase by charge accumulation. This enables to realize structured-light systems or stereovision with improved tolerance of background light. The amount of accumulated photocharges is $d=\Sigma_{k=1}^{n}(q_{1,k}-q_{2,k})$, where $q_{1,k}$ and $q_{2,k}$ are the charges accumulated in the k-th time interval of exposure of frame number 1, which may be an illuminated frame, for example, and frame number 2, which may be a dark frame. The duration of the corresponding time intervals can be different.

In embodiments of the pixel structure, more than two different frames can be subtracted (e. g. for m different image acquisitions), by use of more than one capacitor in the pixel. Each of the frames $q_{1,k}$, i=1, 2, 3, . . . , m, can have an exposure time that differs from the exposure times of the other frames. Such pixels allow to do charge arithmetic and frame-to-frame calculations in the pixel.

It is advantageous that the subtraction operation can be executed inside the pixel during the image acquisition phase. It is also favourable that, after subtraction, successive acquisitions can be accumulated in the pixel. This improves the saturation level that can be accumulated in the pixel. The described pixel structure allows a compact implementation, because it requires only one photodetector, one capacitor, two transfer gates, two reset switches, and a source follower and select transistor in the pixel. It is compatible with backside illumination. Different timing allows to store a simple non-subtracted image with large full well charge.

The described image sensor can also be used in a camera system where an object is tracked. This object is illuminated by a flashed illumination or contains a flashed light source, which is synchronized to the images collected on FD1 or on FD2.

The described image sensor can also be used in a system where two structured light patterns are projected, and the first structured light pattern is integrated on FD1 while the second structured light pattern is integrated on FD2. This can further enhance the information that can be extracted from the projected patterns. Such information could include depth information. This depth information could be calculated from triangulation principles.

Similarly, the system could be operated with two light sources at two different wavelengths. E. g. for eye tracking applications, it is known that the eye reflects certain wavelengths and absorbs other wavelengths, leading to a high contrast in a differential image which is the difference between these two images. The proposed image sensor pixel allows to generate such profile.

The invention claimed is:

1. A pixel structure for a semiconductor imaging device, comprising:
   a photodetector in a semiconductor material;
   a first transfer gate between the photodetector and a first diffusion region in the semiconductor material;
   a second transfer gate between the photodetector and a second diffusion region in the semiconductor material;
   a capacitor connected between the first diffusion region and the second diffusion region;
   a first switch connected between the first diffusion region and a first reference voltage;
   a second switch connected between the second diffusion region and a second reference voltage; and
   a select transistor connected to a column bus.

2. The pixel structure according to claim 1, wherein
   the photodetector is a pinned photodiode in a substrate comprising the semiconductor material.

3. The pixel structure according to claim 1, further comprising:
   buffer amplifiers connected to the first diffusion region and the second diffusion region.

4. The pixel structure according to claim 1, wherein the first reference voltage and the second reference voltage are equal.

5. The pixel structure according to claim 4, wherein the first reference voltage and the second reference voltage are equal to a supply voltage.

6. The pixel structure according to claim 1, wherein the first reference voltage or the second reference voltage is connected to a supply voltage.

7. The pixel structure according to claim 1, further comprising:
   a source follower formed by a field-effect transistor, which is connected to the select transistor, a gate of the source follower connected to the first diffusion region.

8. An image sensor device comprising a two-dimensional array of pixel structures according to claim 1.

9. An imaging system including an image sensor device according to claim 8, further comprising:
   a light source synchronized to the image sensor device, wherein the light source is configured to be active when the signal is acquired on the first diffusion region and not active when the signal is acquired on the second diffusion region, or vice versa.

10. The imaging system according to claim 9, wherein the light source is configured to project a pattern or sequence of patterns on a scene to be imaged.

11. A method of operating the pixel structure according to claim 1, comprising:
discharging the capacitor by closing both the first switch and the second switch into a connecting state,
acquiring a first signal on the photodetector and transferring the first signal to the first diffusion region by a charge transfer pulse on the first transfer gate, while the second switch is closed in a connecting state,
acquiring a second signal on the photodetector and transferring the second signal to the second diffusion region by a charge transfer pulse on the second transfer gate, while the first switch is closed in a connecting state, and
after acquisition of the signals, reading the pixel signal out from the first diffusion region while the second diffusion region is connected to the second reference voltage via the second switch.

12. The method according to claim 11, wherein
the second transfer gate is at a higher electric potential than the first transfer gate during readout of the pixel signal.

13. The method according to claim 11, wherein
first and second signals are repeatedly acquired and accumulated on the capacitor.

14. The method according to claim 11, wherein
at least one of the charge transfer pulse on the first transfer gate and the charge transfer pulse on the second transfer gate is a multiple pulse.

15. The method according to claim 11, wherein the operation of the pixel structure is synchronously performed with the operation of a structured-light projector.

16. A pixel structure for a semiconductor imaging device, comprising:
a photodetector in a semiconductor material;
a first transfer gate between the photodetector and a first diffusion region in the semiconductor material;
a second transfer gate between the photodetector and a second diffusion region in the semiconductor material;
a capacitor connected between the first diffusion region and the second diffusion region;
a first switch connected between the first diffusion region and a first reference voltage; and
a second switch connected between the second diffusion region and a second reference voltage,
wherein the first reference voltage is different than the second reference voltage.

17. A pixel structure for a semiconductor imaging device, comprising:
a photodetector in a semiconductor material;
a first transfer gate between the photodetector and a first diffusion region in the semiconductor material;
a second transfer gate between the photodetector and a second diffusion region in the semiconductor material;
a capacitor connected between the first diffusion region and the second diffusion region;
a first switch connected between the first diffusion region and a first reference voltage;
a second switch connected between the second diffusion region and a second reference voltage; and
a light source synchronized to the image sensor device, wherein the light source is configured to be active when the signal is acquired on the first diffusion region and not active when the signal is acquired on the second diffusion region, or vice versa.

* * * * *